United States Patent

Kajiwara

[11] Patent Number: 5,945,930
[45] Date of Patent: Aug. 31, 1999

[54] DATA PROCESSING APPARATUS

[75] Inventor: Hiroshi Kajiwara, Tokyo, Japan

[73] Assignee: Canon Kabushiki Kaisha, Tokyo, Japan

[21] Appl. No.: 08/549,070

[22] Filed: Oct. 27, 1995

[30] Foreign Application Priority Data

Nov. 1, 1994 [JP] Japan .................................. 6-268670

[51] Int. Cl.⁶ .................................................. H04N 5/00
[52] U.S. Cl. .................................. 341/50; 341/106; 341/65
[58] Field of Search ............................. 341/50, 65, 67, 341/106

[56] References Cited

U.S. PATENT DOCUMENTS

| | | |
|---|---|---|
| 4,514,753 | 4/1985 | Southworth et al. ................... 358/11 |
| 5,073,820 | 12/1991 | Nakagawa et al. ..................... 358/133 |
| 5,245,427 | 9/1993 | Kunihiro ................................ 358/133 |
| 5,278,871 | 1/1994 | Rasky et al. ............................. 375/99 |
| 5,430,556 | 7/1995 | Ito ........................................... 358/427 |
| 5,481,364 | 1/1996 | Ito .......................................... 358/261.1 |
| 5,521,717 | 5/1996 | Maeda .................................... 358/426 |

*Primary Examiner*—Howard L. Williams
*Assistant Examiner*—Peguy JeanPierre
*Attorney, Agent, or Firm*—Fitzpatrick, Cella, Harper & Scinto

[57] ABSTRACT

A data processing apparatus has a decoder for decoding coded data subjected to first entropy coding into a DCT (discrete cosine transform) coefficient in discrete cosine transform coding, and an encoder for conducting second entropy coding on the DCT coefficient obtained by the decoder.

11 Claims, 3 Drawing Sheets

DATA PROCESSING APPARATUS

BACKGROUND OF THE INVENTION

1. Field of the Invention

The present invention relates to a data processing apparatus, and more particularly, to a data processing apparatus suitably used to transmit and store image data and the like.

2. Description of the Related Art

In conventional transmission and storage of still pictures in various fields, such as color facsimile, still picture telephone/conference, printing and newspaper picture transmission, data coding is generally performed by using Joint Photographic Experts Group (abbreviated as "JPEG" hereinafter) that is an internationally standardized coding method.

The JPEG method subjects image data to discrete cosine transform coding (abbreviated as "DCT" hereinafter), quantizes a DCT coefficient obtained by DCT, and performs Huffman coding on the quantized coefficient. Although a quantization table for quantization and a Huffman table for Huffman coding can be set freely in performing JPEG coding, it is difficult to construct Huffman tables best-suited to respective images since much time and much memory are needed in coding.

Accordingly, most of conventional data processing apparatuses have no function for constructing an optimum Huffman table, and encode all images by using a preset default Huffman table. Therefore, if data encoded by using the default Huffman table is received, it is stored in a storage device or sent to another device just as it is.

However, when JPEG-coded data is stored or transmitted by using such a default Huffman table, the amount of data is larger than that in the coding using the optimal Huffman table, which needs much memory and much data transmission time. In particular, the above problems are severe in a case in which JPEG-coded data is received from various applications and massive amounts of image data is stored as in an image database.

SUMMARY OF THE INVENTION

Accordingly, an object of the present invention is to provide a data processing apparatus which can improve coding efficiency and reduce the amount of data.

In order to solve the above problems, a data processing apparatus according to an embodiment of the present invention comprises a decoding means for decoding coded data subjected to first entropy coding into a DCT coefficient in discrete cosine transform coding, and an encoding means for conducting second entropy coding on the DCT coefficient obtained by the decoding means.

A data processing apparatus according to another embodiment of the present invention comprises a first decoding means for decoding first coded data subjected to first entropy coding into a DCT coefficient in discrete cosine transform coding, a first encoding means for obtaining second coded data by conducting second entropy coding on the DCT coefficient obtained by the first decoding means, a second decoding means for decoding the second coded data into a DCT coefficient in discrete cosine transform coding, and a second encoding means for conducting third entropy coding on the DCT coefficient obtained by the second decoding means.

According to the above embodiments, a DCT coefficient is reproduced by decoding data which has been once coded, and subjected to optimum coding, which makes it possible to improve coding efficiency and to reduce the amount of data.

These and other objects, features and advantages of the present invention will become more apparent from the following description of the preferred embodiments taken in conjunction with the accompanying drawings.

DESCRIPTION OF THE PREFERRED EMBODIMENTS

Figure 1:
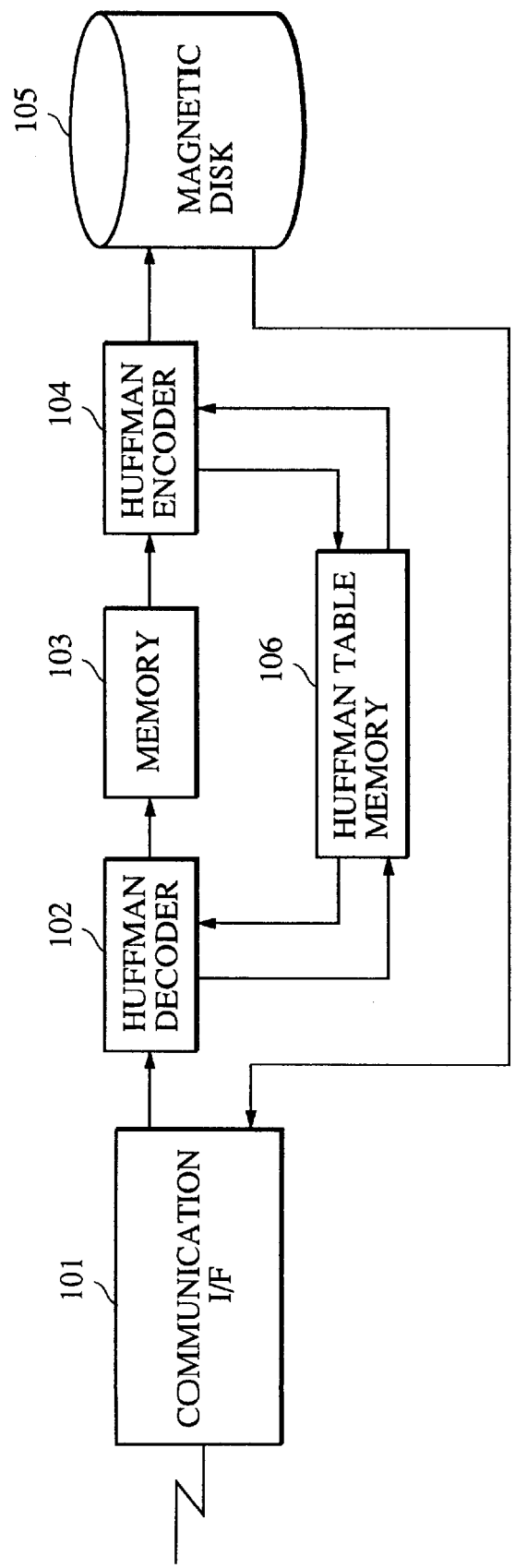
FIG. 1 is a block diagram showing the configuration of a data processing apparatus according to a first embodiment of the present invention.

A first embodiment of the present invention will now be described with reference to FIG. 1. FIG. 1 is a block diagram showing the configuration of a data processing apparatus according to the first embodiment of the present invention.

Referring to FIG. 1, the data processing apparatus comprises a communication interface 101, a Huffman decoder 102, a memory 103, a Huffman encoder 104, a magnetic disk 105, and a Huffman table memory 106.

Next, description will be given to the operation of the data processing apparatus according to the first embodiment of the present invention.

First, when data encoded by JPEG (referred to as "JPEG data" hereinafter) is received by the communication interface 101, it is sent to the Huffman decoder 102. The Huffman decoder 102 constructs a Huffman table used in the JPEG data based on information in a Huffman table definition division, that starts with a DHT (Define Huffman Tables) marker, included in the JPEG data, and stores the Huffman table in the Huffman table memory 106. After that, markers and header information in the JPEG data are stored in the memory 103 just as they are, and only a portion corresponding to a DCT coefficient expressed in Huffman code is processed to be decoded into a DCT coefficient with reference to the Huffman table stored in the Huffman table memory 106. In this processing, the group number (SSSS) of a DC difference and an overhead bit indicating the value of the DC difference are generated in a DC component of the DCT coefficient, and stored in the memory 103. Furthermore, the run length (NNNN) of a succession of coefficients 0, the group number (SSSS) of an AC component of the DCT coefficient and an overhead bit indicating the value of the AC component are generated in the AC component, and stored in the memory 103.

Subsequently, the Huffman encoder 104 reads out a symbol (the group number (SSSS) in the DC component of the DCT coefficient, and a combination of the run length (NNNN) and the group number (SSSS) in the AC component of the DCT coefficient) from the memory 103, checks the probability of its occurrence, constructs a new optimal Huffman table according to the occurrence probability, and stores the Huffman table in the Huffman table memory 106. Then, the markers and the header information in the JPEG data are read out from the memory 103 just as they are, and data to the DHT marker, that indicates the start of the Huffman table definition division, is stored in the magnetic disk 105 as it is. If the data read out from the memory 103 is a DHT marker, a Huffman table definition division is newly generated based on the above reconstructed Huffman table stored in the Huffman table memory 106, and stored in the magnetic disk 105.

After that, markers and header information are sequentially read out from the memory 103 again and stored in the magnetic disk 105 while skipping the Huffman table definition division read out from the memory 103. A DCT coefficient existing after an SOS (Start Of Scan) marker is encoded according to the Huffman table in the Huffman table memory 106 after reading the symbol from the memory 103, and the coded data is stored in the magnetic disk 105 together with an overhead bit. In other words, various pieces of information, such as a restart marker, are left as they are, and only a DCT coefficient is subjected to Huffman coding according to the reconstructed Huffman table. Data to an EOI (End Of Image) marker is thus processed.

In the first embodiment of the present invention, since data to be stored in the magnetic disk 105 is coded data which can be decoded by JPEG baseline process, JPEG data stored in the magnetic disk 105 may be transmitted to other JPEG decoders just as it is.

Figure 2:
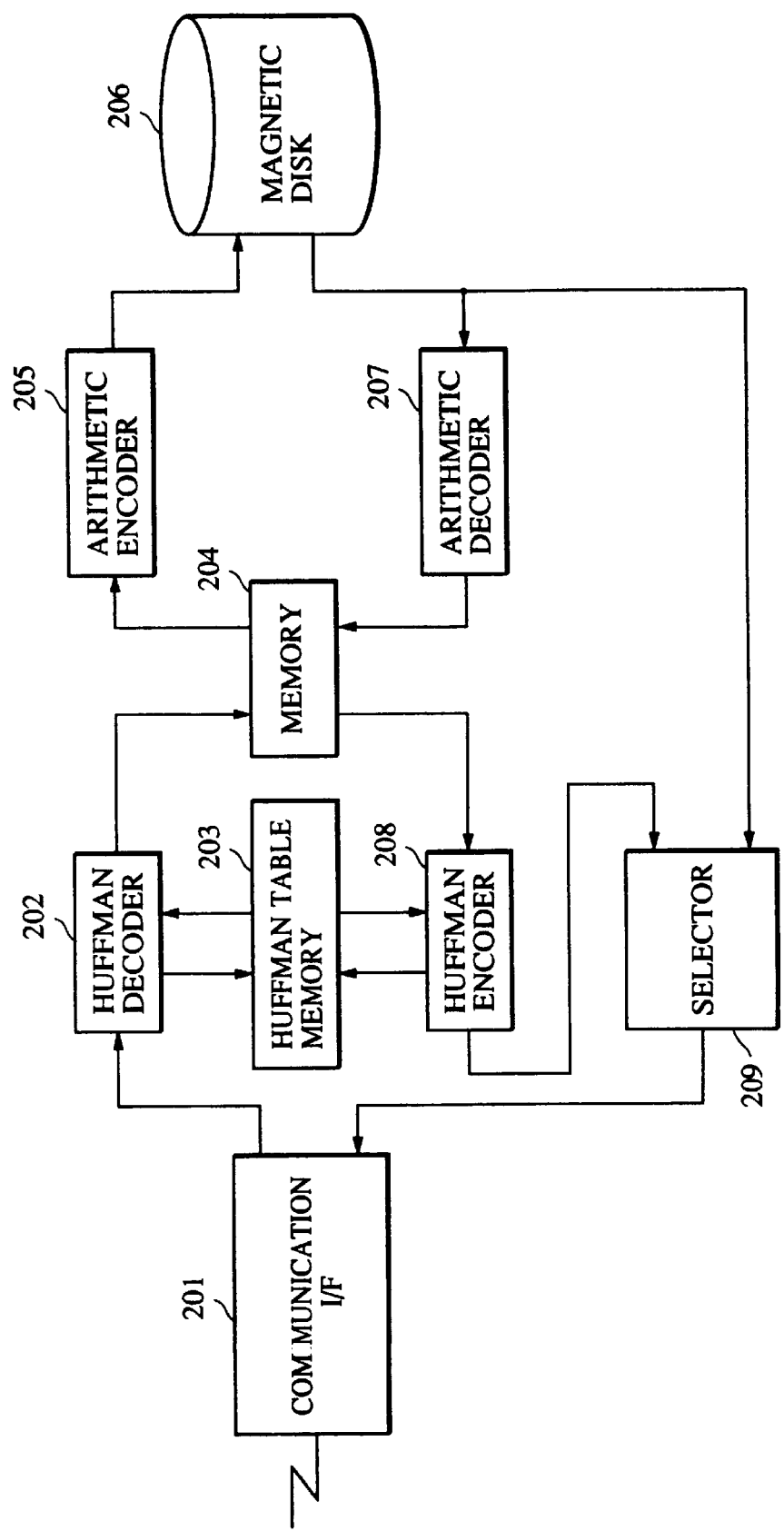
FIG. 2 is a block diagram showing the configuration of a data processing apparatus according to a second embodiment of the present invention.

Next, a second embodiment of the present invention will be described with reference to FIG. 2. FIG. 2 is a block diagram showing the configuration of a data processing apparatus according to the second embodiment of the present invention.

Referring to FIG. 2, the data processing apparatus comprises a communication interface 201, a Huffman decoder 202, a Huffman table memory 203, a memory 204, an arithmetic encoder 205, a magnetic disk 206, an arithmetic decoder 207, a Huffman encoder 208, and a selector 209.

The data storage operation of the data processing apparatus according to the second embodiment of the present invention will be described.

First, when JPEG data is received by the communication interface 201, it is sent to the Huffman decoder 202. The Huffman decoder 202 constructs a Huffman table used in the JPEG data based on information in a Huffman table definition division, that starts with a DHT marker, included in the JPEG data, and stores the Huffman table in the Huffman table memory 203. After that, markers and header information in the JPEG data excluding the Huffman table definition division are stored in the memory 204 just as they are, and only a portion corresponding to a DCT coefficient expressed in Huffman code is decoded into a DCT coefficient with reference to the Huffman table stored in the Huffman table memory 203.

In this decoding, the group number (SSSS) of a DC difference and an overhead bit indicating the value of the DC difference are generated in a DC component of the DCT coefficient, and returned to the DCT coefficient again to be stored in the memory 204. Furthermore, the run length (NNNN) of a succession of coefficients 0, the group number (SSSS) of an AC component of the DCT coefficient and an overhead bit indicating the value of the AC component are generated in the AC component. After a number of coefficients 0 corresponding to the run length (NNNN) are stored as a DCT coefficient (invalid coefficient) in the memory 204, a DCT coefficient (valid coefficient) is found from the group number (SSSS) and the overhead bit, and stored in the memory 204.

The arithmetic encoder 205 reads out various information and the DCT coefficients from the memory 204, generates JPEG data, which uses arithmetic code as code for entropy coding, based on the various information and the DCT coefficients, and stores the JPEG data in the magnetic disk 206.

Then, description will be given to the operation for transmitting the JPEG data, stored in the magnetic disk 206 as mentioned above, to another external data processing apparatus.

First, the arithmetic decoder 207 reads out necessary JPEG data from the magnetic disk 206, and stores various pieces of information, excluding header information about arithmetic codes, in the memory 204 just as they are. The JPEG data corresponding to a DCT coefficient is decoded into the DCT coefficient and stored in the memory 204.

Next, the Huffman encoder 208 reads out the DCT coefficient from the memory 204, constructs a new Huffman table according to the DCT coefficient, and stores the Huffman table in the Huffman table memory 203. JPEG data which uses Huffman code as code for entropy coding is generated based on the various information and the DCT coefficient stored in the memory 204 with reference to the above-mentioned Huffman table newly constructed and stored in the Huffman table memory 203, and sent to the selector 209.

The selector 209 sends the arithmetically coded data stored in the magnetic disk 206 to the communication interface 201 just as it is when a data processing apparatus requesting data transmission has a JPEG optional function, and sends the Huffman coded data from the Huffman encoder 208 to the communication interface 201 when the data processing apparatus has only essential functions. The communication interface 201 transmits the JPEG data sent from the selector 209 to the outside.

In the second embodiment of the present invention, since data stored in the magnetic disk 206 is subjected to arithmetic coding as a JPEG optional function, JPEG data stored in the magnetic disk 206 can be transmitted to the decoder, which has the JPEG optional function, just as it is.

Figure 3:
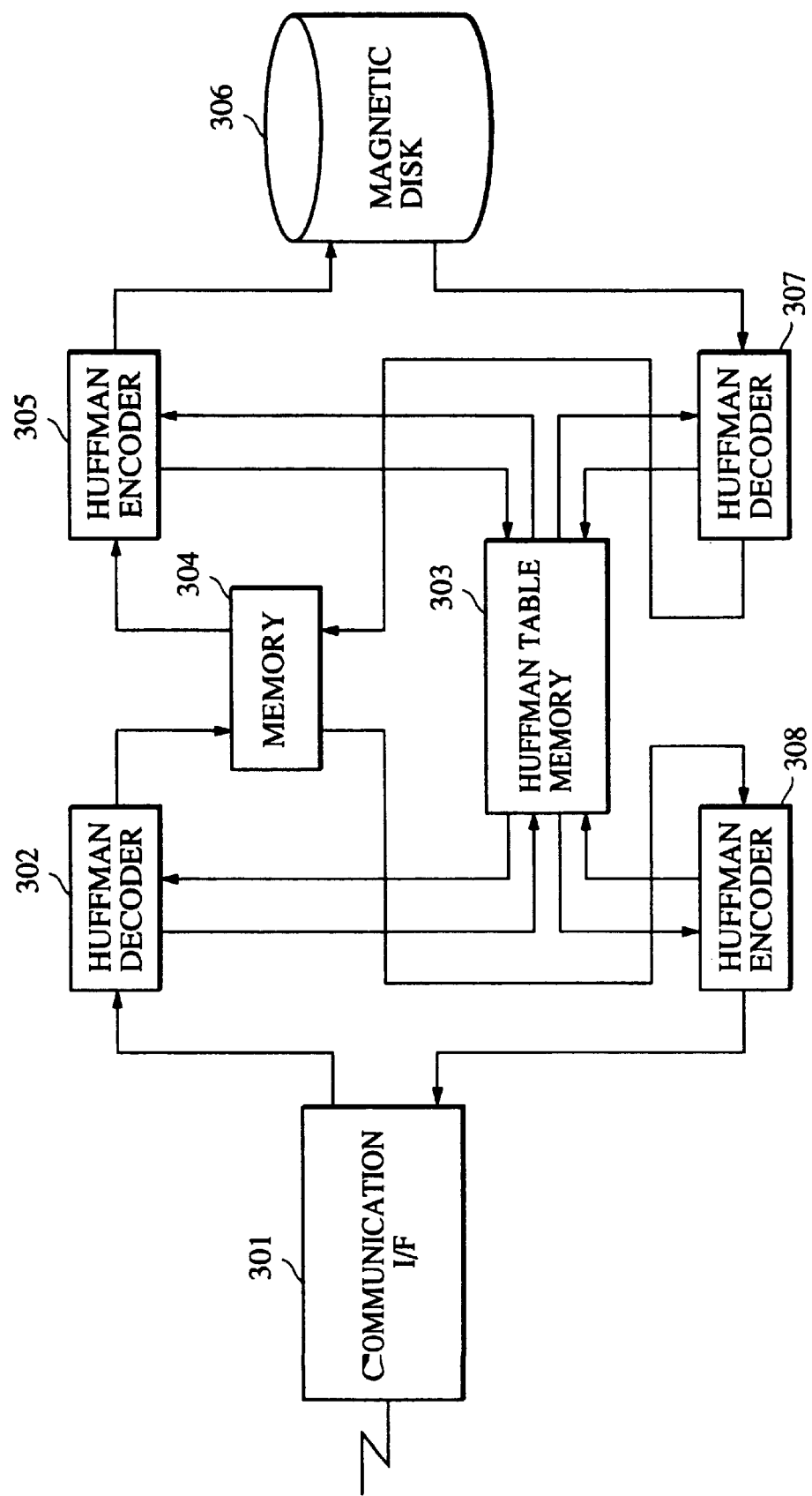
FIG. 3 is a block diagram showing the configuration of a data processing apparatus according to a third embodiment of the present invention.

A third embodiment of the present invention will now be described with reference to FIG. 3. FIG. 3 is a block diagram showing the configuration of a data processing apparatus according to the third embodiment of the present invention.

Referring to FIG. 3, the data processing apparatus comprises a communication interface 301, Huffman decoders 302 and 307, a Huffman table memory 303, a memory 304, Huffman encoders 305 and 308, and a magnetic disk 306.

Next, the data storage operation of the data processing apparatus according to the third embodiment of the present invention will be described.

First, when JPEG data is received by the communication interface 301, it is sent to the Huffman decoder 302. The Huffman decoder 302 constructs a Huffman table used in the JPEG data based on information in a Huffman definition division, that starts with a DHT marker, included in the JPEG data, and stores the Huffman table in the Huffman table memory 303. After that, markers and header information in the JPEG data excluding the Huffman table definition division are stored in the memory 304 just as they are, and only a portion corresponding to a DCT coefficient expressed in Huffman code is decoded into the DCT coefficient with reference to the Huffman table stored in the Huffman table memory 303.

In this decoding, the group number (SSSS) of a DC difference and an overhead bit indicating the value of the DC difference are generated in a DC component of the DCT coefficient, and returned into the DCT coefficient to be stored in the memory 304. Furthermore, the run length (NNNN) representing the length of a succession of coefficients 0, the group number (SSSS) of an AC component of the DCT coefficient, and an overhead bit indicating the value of the AC component are generated in the AC coefficient. After a number of coefficients 0 corresponding to the run length (NNNN) are stored as a DCT coefficient (invalid coefficient) in the memory 304, a DCT coefficient (valid coefficient) is found from the group number (SSSS) and the overhead bit and stored in the memory 304.

Next, the Huffman encoder 305 reads out various pieces of information, such as header information, from the memory 304, and stores the information in the magnetic disk 306 just as it is. Furthermore, the probability of occurrence of DCT coefficients stored in the memory 304 is checked. Huffman tables best-suited to respective DCT coefficients are newly constructed with reference to the occurrence probability, and stored in the Huffman table memory 303. Then, the DCT coefficients are subjected to Huffman coding according to the Huffman tables stored in the Huffman table memory 303, and stored in the magnetic disk 306. At this time, the Huffman tables stored in the Huffman table memory 303 are also stored in the magnetic disk 306. In this case, coded data to be stored in the magnetic disk 306 may take other data forms than JPEG.

Description will now be given to transmission of the coded data, stored in the magnetic disk 306 as mentioned above, to another external data processing apparatus.

First, the Huffman decoder 307 reads out necessary coded data from the magnetic disk 306, and stores the Huffman table added to the coded data in the Huffman table memory 303. Various pieces of information, such as header information, are stored in the memory 304 just as they are, and coded data corresponding to DCT coefficients are decoded into the DCT coefficients with reference to the Huffman table stored in the Huffman table memory 303, and stored in the memory 304.

Next, the Huffman encoder 308 rearranges the DCT coefficients, stored in the memory 304, in one-dimensional form by zigzag scanning, and generates the run length (NNNN), the group number (SSSS) and an overhead bit. An optimum Huffman table is newly constructed based on the run length (NNNN) and the group number (SSSS), and stored in the Huffman table memory 303. After that, JPEG data is generated by using various pieces of information stored in the memory 304 and the Huffman table stored in the Huffman table memory 303, and transmitted to the communication interface 301. The communication interface 301 transmits the JPEG data sent from the Huffman encoder 308 to the outside.

The third embodiment of the present invention converts JPEG data into another data form, such as H. 261 (communication coding), and then, stores the data in the magnetic disk 306. For transmission, this coded data is converted from the data form into JPEG data form. Furthermore, the JPEG data may be subjected to the above-mentioned arithmetic coding and then stored in the magnetic disk 306.

Although the data processing apparatuses according to the first, second and third embodiments of the present invention each use JPEG data as coded data, the present invention may be applied to data encoded by MPEG (Motion Picture Coding Experts Group) or H. 261 (communication coding).

According to the present invention, coding efficiency can be improved, which reduces the amount of data in transmission and storage.

What is claimed is:

1. A data processing apparatus, comprising:

input means for inputting coded data subjected to first entropy coding using a predetermined entropy encoding table, the coded data having undergone orthogonal transformation;

first decoding means for decoding the coded data input by said input means into a plurality of orthogonal transform coefficients by using the predetermined entropy encoding table, wherein the plurality of orthogonal transform coefficients and the coded data have a first relationship therebetween; and first encoding means for performing second entropy re-coding on the plurality of orthogonal transform coefficients outputted by said first decoding means, so as to obtain second coded data, wherein said first encoding means performs second entropy re-coding on at least some of the orthogonal transform coefficients so that plurality of orthogonal transform coefficients and the second coded data have a second relationship therebetween different from the first relationship.

2. A data processing apparatus according to claim 1 wherein said first coding and said second coding are each Huffman coding.

3. A data processing apparatus according to 2, wherein said encoding means reconstructs a Huffman table in the Huffman coding.

4. A data processing apparatus according to claim 1 wherein said first coding is Huffman coding and said second coding is arithmetic coding.

5. A data processing apparatus according to claim 1, wherein said first entropy coding is JPEG coding and said second entropy coding is another type of coding.

6. A data processing apparatus according to claim 1, further comprising:

storage means for storing the second coded data output by said first coding means.

7. A data processing apparatus according to claim 6, further comprising:

second decoding means for decoding the second coded data stored by said storage means into an orthogonal transform coefficient; and second encoding means for performing third entropy coding on the orthogonal transform coefficient obtained by said second decoding means.

8. A data processing apparatus according to claim 7, wherein the first and third entropy codings are each JPEG coding and the second entropy coding is another type of coding.

9. A data processing apparatus comprising:

input means for inputting coded data subjected to first entropy Huffman coding, the coded data having undergone orthogonal transformation;

first decoding means for decoding the coded data input by said input means into an orthogonal transform DCT coefficient; and first encoding means for performing second entropy Huffman re-coding on the DCT coefficient outputted by said first decoding means, so as to obtain second coded data, wherein the coded data is data encoded by Joint Photographic Experts Group (JPEG) coding, said first decoding means generates a run length, a group number and an overhead bit in the DCT coefficient obtained from the coded data, and said first encoding means reconstructs a Huffman table based on the run length and the group number, and performs Huffman coding by using said Huffman table.

10. A data processing method, comprising the steps of:

inputting coded data subjected to first entropy coding using a predetermined entropy encoding table, the coded data having undergone orthogonal transformation;

decoding the coded data input by said input step into a plurality of orthogonal transform coefficients by using the predetermined entropy encoding table, wherein the plurality of orthogonal transform coefficients and the coded data have a first relationship therebetween; and performing second entropy re-coding on the plurality of orthogonal transform coefficients outputted by said decoding steps, wherein said re-coding step performs second entropy re-coding on at least some of the orthogonal transform coefficients so that plurality of orthogonal transform coefficients and the second coded data have a second relationship therebetween different from the first relationship.

11. A data processing method comprising the steps of:

inputting coded data subjected to first entropy Huffman coding, the coded data having undergone orthogonal transformation;

decoding the coded data input by said input step into an orthogonal transform DCT coefficient; and performing second entropy Huffman re-coding on the DCT coefficient outputted by said decoding step, so as to obtain second coded data, wherein the coded data is data encoded by Joint Photographic Experts Group (JPEG) coding, said decoding step generates a run length, a group number and an overhead bit in the DCT coefficient obtained from the coded data, and said re-coding step reconstructs a Huffman table based on the run length and the group number, and performs Huffman coding by using said Huffman table.

* * * * *

UNITED STATES PATENT AND TRADEMARK OFFICE
CERTIFICATE OF CORRECTION

| | | |
|---|---|---|
| PATENT NO. | : | 5,945,930 |
| DATED | : | August 31, 1999 |
| INVENTOR(S) | : | HIROSHI KAJIWARA |

It is certified that error appears in the above-identified patent and that said Letters Patent is hereby corrected as shown below:

COLUMN 6

Line 29, "claim 1" should read --claim 1,--.

COLUMN 7

Line 15, "steps," should read --step,--.

Signed and Sealed this

Twentieth Day of June, 2000

Attest:

Q. TODD DICKINSON

*Attesting Officer*   *Director of Patents and Trademarks*